US008790867B2

(12) United States Patent  
Bae et al.

(10) Patent No.: US 8,790,867 B2  
(45) Date of Patent: Jul. 29, 2014

(54) METHODS OF FORMING PHOTOLITHOGRAPHIC PATTERNS BY NEGATIVE TONE DEVELOPMENT

(71) Applicant: Rohm and Haas Electronic Material LLC, Marlborough, MA (US)

(72) Inventors: Young Cheol Bae, Austin, TX (US); Jibin Sun, San Mateo, CA (US); Seung-Hyun Lee, Marlborough, MA (US); Jong Keun Park, Hudson, MA (US); Cecily Andes, Watertown, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 13/668,218

(22) Filed: Nov. 3, 2012

(65) Prior Publication Data

US 2013/0115559 A1 May 9, 2013

Related U.S. Application Data

(60) Provisional application No. 61/555,462, filed on Nov. 3, 2011.

(51) Int. Cl.  
*G03F 7/26* (2006.01)

(52) U.S. Cl.  
USPC .................................................. 430/325

(58) Field of Classification Search  
CPC .......... G03F 7/0397; G03F 7/20; G03F 7/325  
USPC ................................................. 430/322, 325  
See application file for complete search history.

(56) References Cited

U.S. PATENT DOCUMENTS

| | | | |
|---|---|---|---|
| 5,738,975 | A | 4/1998 | Nakano et al. |
| 7,556,908 | B2 | 7/2009 | Takemoto et al. |
| 2005/0064326 | A1 | 3/2005 | Yasunami et al. |
| 2009/0011366 | A1 | 1/2009 | Tsubaki et al. |
| 2011/0159253 | A1 | 6/2011 | Kang et al. |
| 2012/0183981 | A1 | 7/2012 | Norman et al. |
| 2013/0302735 | A1 | 11/2013 | Sun et al. |

FOREIGN PATENT DOCUMENTS

| | | |
|---|---|---|
| JP | 2002-193895 | 7/2002 |
| JP | 2002221796 A | 8/2002 |
| WO | WO 2005/108343 A1 | 11/2005 |
| WO | WO 2011/034007 A1 | 3/2011 |
| WO | 2011105626 A1 | 9/2011 |

OTHER PUBLICATIONS

Takemoto et al. "Tailoring thermal property of ArF resists resins through monomer structure modification for sub-70 nm contact hole application by reflow process"; Advances in Resist Technology and Processing XX11; Proceedings of SPIE vol. 5753 (SPIE, Bellingham, WA), 2005; pp. 584-591.

Chinese Search report of corresponding Chinese Application No. 2012-10597633.6; Dispatch Date: Mar. 4, 2014.

*Primary Examiner* — Brittany Raymond  
(74) *Attorney, Agent, or Firm* — Jonathan D. Baskin

(57) ABSTRACT

Provided are methods of forming photolithographic patterns by negative tone development. The methods employ a photoresist composition that includes a polymer having a unit of the following general formula (I):

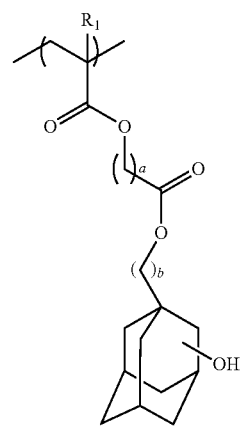

wherein: $R_1$ represents hydrogen or a $C_1$ to $C_3$ alkyl group; a represents an integer from 1 to 3; and b represents 0 or 1. The methods find particular applicability in the manufacture of semiconductor devices.

11 Claims, 4 Drawing Sheets

METHODS OF FORMING PHOTOLITHOGRAPHIC PATTERNS BY NEGATIVE TONE DEVELOPMENT

This application claims the benefit of priority under 35 U.S.C. §119(e) to U.S. Provisional Application No. 61/555,462, filed Nov. 3, 2011, the entire contents of which are incorporated herein by reference.

FIELD

The invention relates generally to the manufacture of electronic devices. More specifically, this invention relates to photolithographic methods which allow for the formation of fine patterns using a negative tone development process. The invention finds particular use in semiconductor device manufacturing and allows for the formation of fine patterns.

INTRODUCTION

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a resin having acid-labile leaving groups and a photoacid generator. Exposure to actinic radiation causes the acid generator to form an acid which, during post-exposure baking, causes cleavage of the acid-labile groups in the resin. This creates a difference in solubility characteristics between exposed and unexposed regions of the resist in an aqueous alkaline developer solution. Exposed regions of the resist are soluble in the aqueous alkaline developer and are removed from the substrate surface, whereas unexposed regions, which are insoluble in the developer, remain after development to form a positive image.

One approach to achieving nm-scale feature sizes in semiconductor devices is the use of short wavelengths of light, for example, 193 nm or less, during exposure of chemically amplified photoresists. To further improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium. When using water as the immersion fluid, the maximum numerical aperture can be increased to a value, for example, from 1.2 to 1.35. With such an increase in numerical aperture, it is possible to achieve a 40 nm half-pitch resolution in a single exposure process, thus allowing for improved design shrink. This standard immersion lithography process, however, is generally not suitable for manufacture of devices requiring greater resolution, for example, for the 20 nm node and beyond.

In an effort to achieve greater resolution and to extend capabilities of existing manufacturing tools, advanced patterning techniques such as various double patterning processes (also referred to as pitch splitting) have been proposed. Another advanced patterning technique for obtaining fine lithographic patterns involves negative tone development (NTD) of traditionally positive-type chemically amplified photoresist materials. In negative tone development, a negative image can be obtained from a traditionally positive-type resist by development with particular organic solvents. Such a process is described, for example, in U.S. Pat. No. 6,790,579 to Goodall et al. That document discloses a photoresist composition comprising an acid-generating initiator and a polycyclic polymer containing recurring acid labile pendant groups along the polymer backbone. The exposed areas can be selectively removed with an alkaline developer or, alternatively, the unexposed regions can be selectively removed by treatment with a suitable nonpolar solvent for negative tone development.

Matrix polymers used in photoresists for advanced patterning applications are typically copolymers that include units formed from monomers containing an acid labile leaving group for polarity switching, monomers containing a lactone group for contrast enhancement and monomers containing a polar group for solubility modification. The use of photoresist matrix polymers containing units formed from hydroxy adamantly acrylate (HADA) or hydroxy adamantly methacrylate (HAMA) monomers as the polar group-containing unit is known. U.S. Application Publication No. 2009/0011366A1 to Tsubaki et al, for example, discloses a negative-tone development method using a resin that comprises a repeating unit formed from such a monomer. It has been discovered by the present inventors that photoresists that include HADA- and HAMA-containing matrix polymers can result in bridging defects in formed resist patterns as a result of relatively slow dissolution rates in organic developers used in negative-tone development processes.

There is a continuing need in the art for improved photolithographic methods which allow for the formation of fine patterns in electronic device fabrication and which address one or more problem associated with the state of the art.

SUMMARY

In accordance with a first aspect of the invention, methods of forming photolithographic pattern by negative tone development are provided. The methods comprise: (a) providing a substrate comprising one or more layer to be patterned; (b) applying a layer of a photoresist composition over the one or more layer to be patterned; (c) patternwise exposing the photoresist composition layer to actinic radiation; (d) heating the exposed photoresist composition layer in a post-exposure bake process; and (e) developing the post-exposure baked photoresist composition layer with an organic solvent developer, thereby forming a photoresist pattern. The photoresist composition comprises a polymer comprising a unit of the following general formula (I):

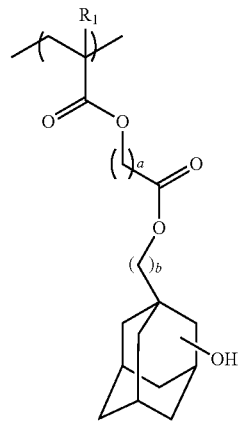

(I)

wherein: $R_1$ represents hydrogen or a $C_1$ to $C_3$ alkyl group; a represents an integer from 1 to 3; and b represents 0 or 1.

As used herein: "g" means grams; wt % means weight percent; "L" means liter; "mL" means milliliter; "nm" means nanometer; "mm" means millimeter; "min" means minute; "h" means hour; "Å" means Angstroms; "mol %" means mole percent; "Mw" means weight average molecular weight; and "Mn" means number average molecular weight; the articles "a" and "an" mean one or more.

BRIEF DESCRIPTION OF THE DRAWINGS

The present invention will be described with reference to the following drawings, in which like reference numerals denote like features, and in which.

DETAILED DESCRIPTION

Photoresist Compositions

Figure 1A:
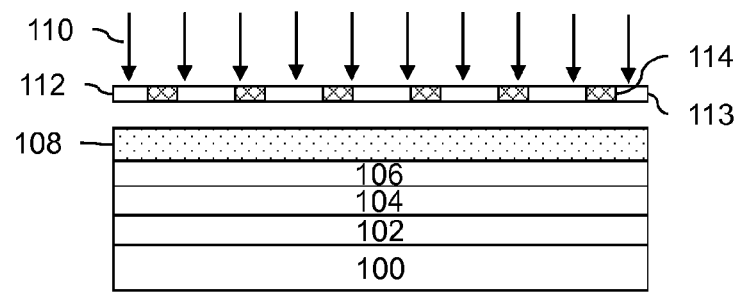
FIG. 1A-E illustrates a process flow for forming a photolithographic pattern in accordance with the invention.

Preferred photoresist compositions of the invention when used to form very fine patterns in a negative tone development process can provide improvements in one or more of resolution, critical dimension (CD) uniformity, pattern collapse margin, focus latitude, exposure latitude, and photospeed as compared with conventional positive-tone photolithographic techniques. The compositions described herein can be used for negative-tone development in dry lithography or immersion lithography processes.

A. Matrix Polymer

The photoresist compositions include a matrix polymer. The matrix polymer as part of a layer of the photoresist composition undergoes a change in solubility in an organic developer as a result of reaction with acid generated from the photoacid generator following softbake, exposure to activating radiation and post exposure bake. The matrix polymer is present in the resist composition in an amount sufficient to obtain a uniform coating of desired thickness. Typically, the matrix polymer is present in the composition in an amount of from 70 to 95 wt % based on total solids of the resist composition.

The matrix polymer includes a first unit formed from a monomer of the following formula (I):

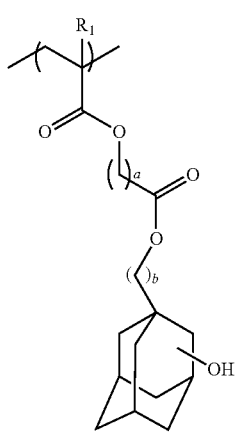

(I)

wherein: $R_1$ represents hydrogen or a $C_1$ to $C_3$ alkyl group, preferably hydrogen or methyl; a represents an integer from 1 to 3, preferably 1; and b represents 0 or 1, preferably 1. It shall be understood for purposes of the description and claims that $R_1$ as defined herein can optionally be substituted, meaning that one or more hydrogen atom can be replaced by another atom such as a halogen, for example, fluorine. The presence of such a unit in the matrix polymer can enhance solubility of the matrix polymer in an organic solvent developer. As a result, unexposed portions of the photoresist composition can be completely removed during development, thereby minimizing or preventing the occurrence of bridging defects in formed resist patterns. The content of the first unit in the polymer, while dependent on the number and types of different units making up the polymer, is typically from 30 to 60 mol %.

Without limitation, suitable monomer units of formula (I) include, for example, the following:

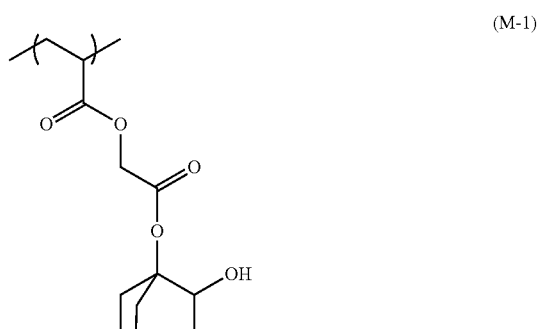

(M-1)

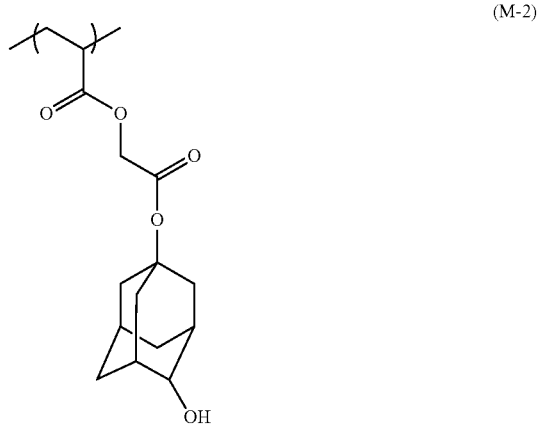

(M-2)

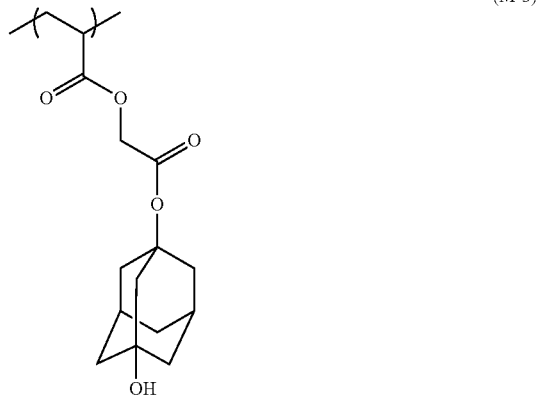

(M-3)

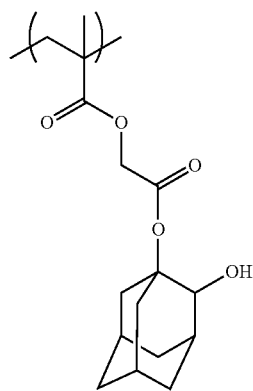
(M-4)
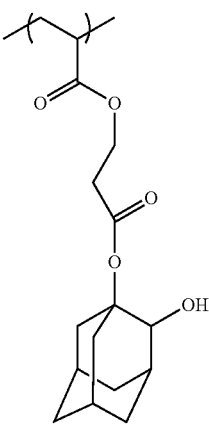
(M-7)
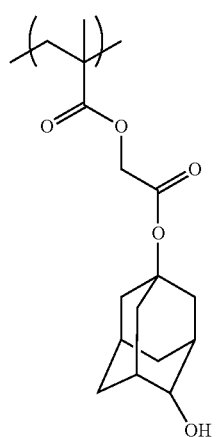
(M-5)
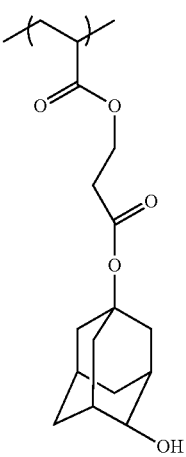
(M-8)
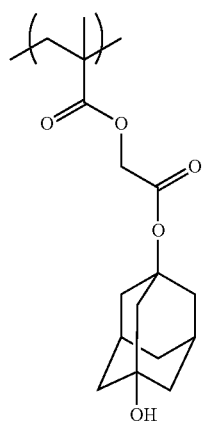
(M-6)
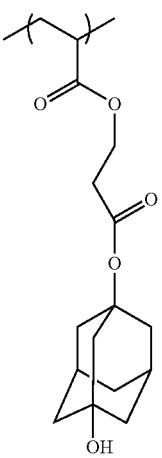
(M-9)

(M-10)
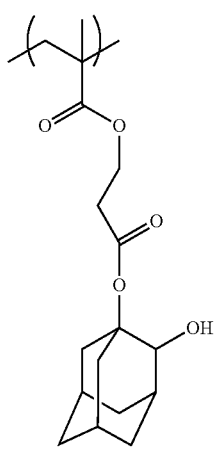
(M-11)
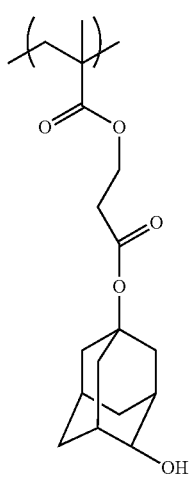
(M-12)
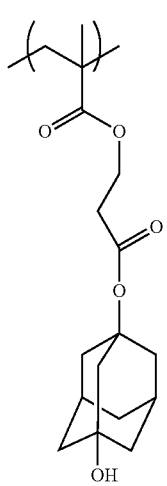
(M-13)
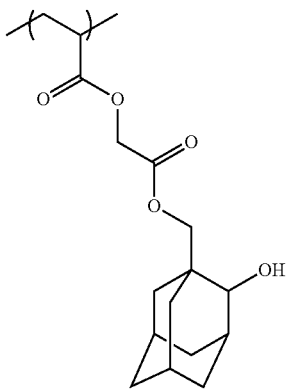
(M-14)
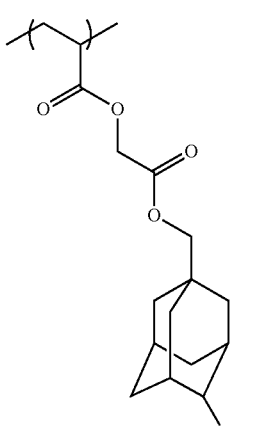
(M-15)
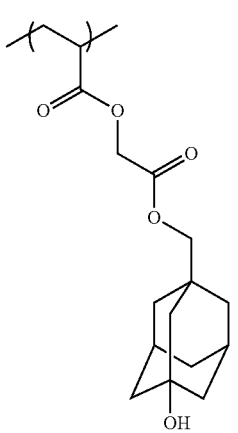
(M-16)

(M-17)
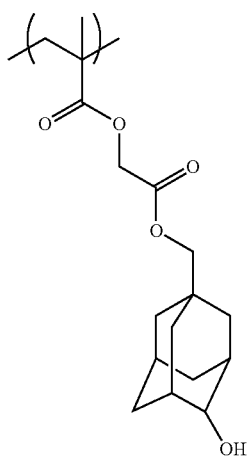
(M-18)
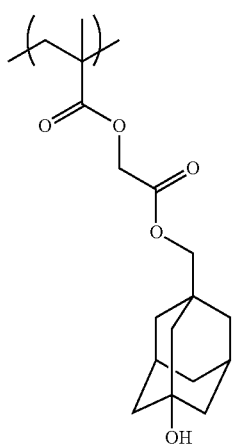
(M-19)
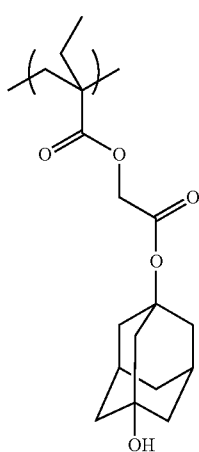
(M-20)
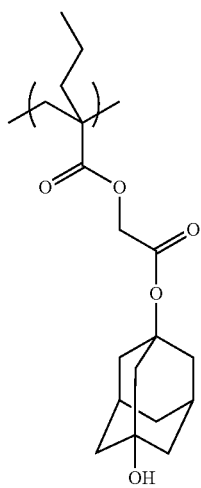
(M-21)
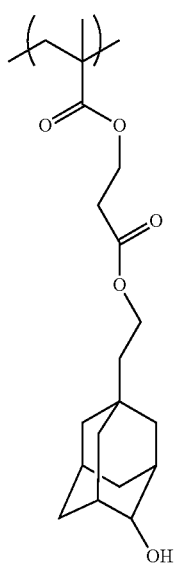
(M-22)
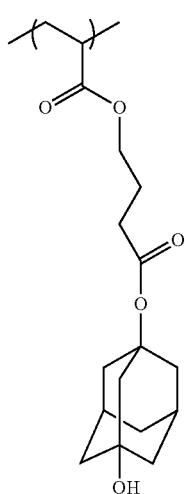

-continued (M-23)

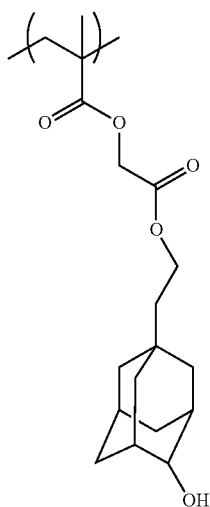

(M-24)

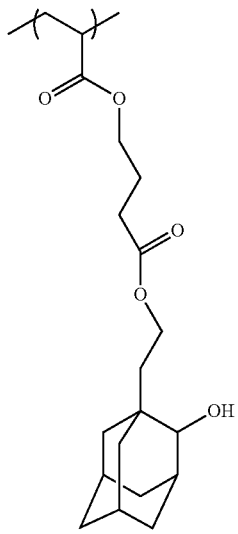

Of these, monomeric units M-15 and M-18 are preferred.

Monomers used in forming the units of formula (I) can be synthesized using known techniques. Suitable methods include those according to standard $SN_2$ nucleophilic substitution mechanism such as shown in process (a) as follows:

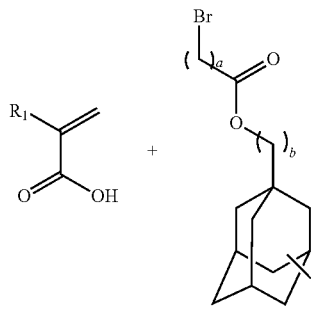

(a)

-continued

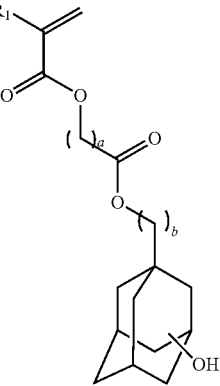

wherein $R_1$, a and b are as defined above. In this synthesis, (alkyl)acrylic acid is commercial available chemical and the adamantanol derivatives can be synthesized according to known techniques, for example, process (b) or (c) as follows:

(b)

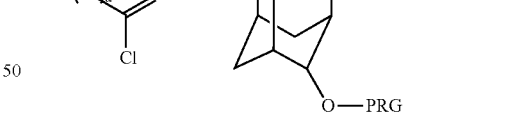

(c)

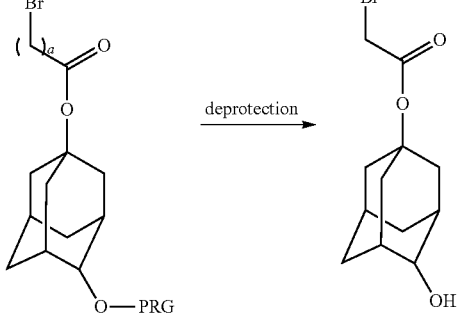

wherein a and b are as defined above. In process (b), when b=1, the primary alcohol group has a significantly higher reaction activity than the hydroxyl group attached to the adamantane ring. As a result, the reaction has good selectivity and extensive purification is typically not needed to remove side-products. However, for process (c), an extra pre-protection of the secondary alcohol group on the adamantane ring is used and the protection group is removed after the substitution reaction. Exemplary methods for preparation of particular monomeric units of general formula (I) are further described below in the Examples.

The matrix polymer further includes units formed from one or more additional monomer, for example, one two, three, four or more additional units different from the first unit. Typically, the additional units will include a (meth)acrylate polymerizable group as with the monomers of the first unit but can include other polymerizable groups, for example, vinyl and non-aromatic cyclic olefins (endocyclic double bond) such as norbornene. The polymer can, for example, include one or more additional unit formed from monomers of formula (I) that are different from the first unit.

To allow for a change in polarity in exposed regions of the photoresist, the matrix polymer preferably includes a monomeric unit having acid labile moieties. Suitable acid labile moieties include, for example, acid-labile (alkyl)acrylate units, for example, units containing ester groups that contain a tertiary non-cyclic alkyl carbon such as t-butyl(meth)acrylate, or containing a tertiary alicyclic carbon such as methyladamantyl(meth)acrylate and ethylfenchyl(meth)acrylate, and other non-cyclic alkyl and alicyclic (alkyl)acrylates such as 2-methyl-acrylic acid 2-(1-ethoxy-ethoxy)-ethyl ester, 2-methyl-acrylic acid 2-ethoxymethoxy-ethyl ester, 2-methyl-acrylic acid 2-methoxymethoxy-ethyl ester, 2-(1-ethoxy-ethoxy)-6-vinyl-naphthalene, 2-ethoxymethoxy-6-vinyl-naphthalene and 2-methoxymethoxy-6-vinyl-naphthalene. Such moieties can impart to the resin of the photoresist composition a property of becoming more soluble in a standard positive tone development developer, for example, 2.38% tetramethyl ammonium hydroxide (TMAH) in water, and less soluble in an NTD developer such as described herein, for example, 2-heptanone or n-butyl acetate, upon irradiation with an actinic ray or radiation by action of a generated acid. Such polymers have been described, for example, in U.S. Pat. No. 6,057,083, European Published Applications EP01008913A1 and EP00930542A1, and U.S. Pat. No. 6,136,501. Other suitable acid-labile (alkyl)acrylate units include those formed from monomers including one or more cyclic acetal moiety, for example:

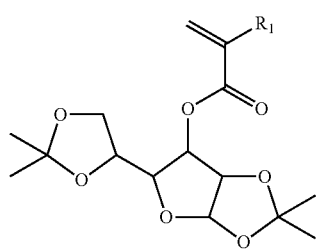

-continued

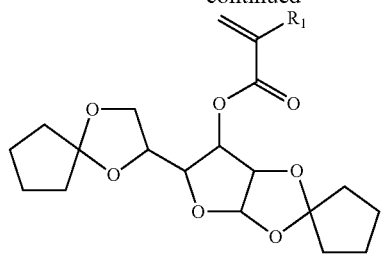

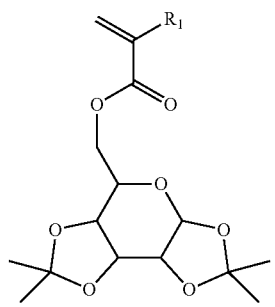

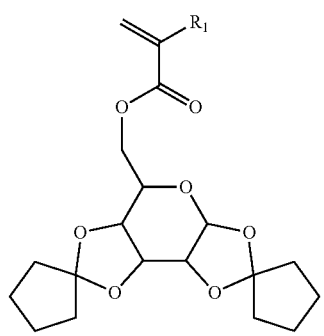

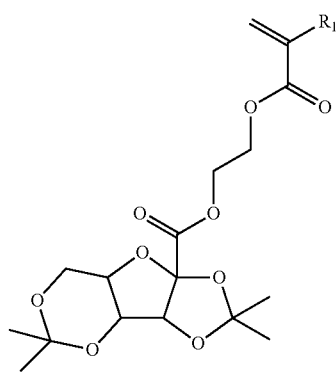

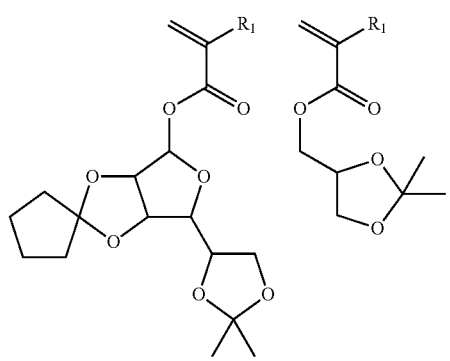

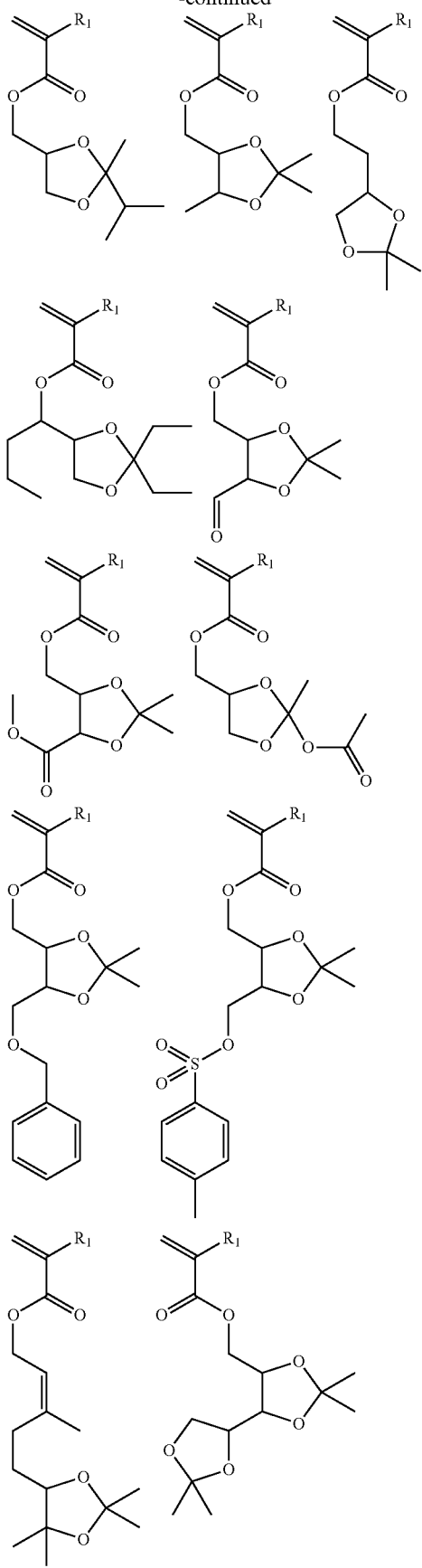
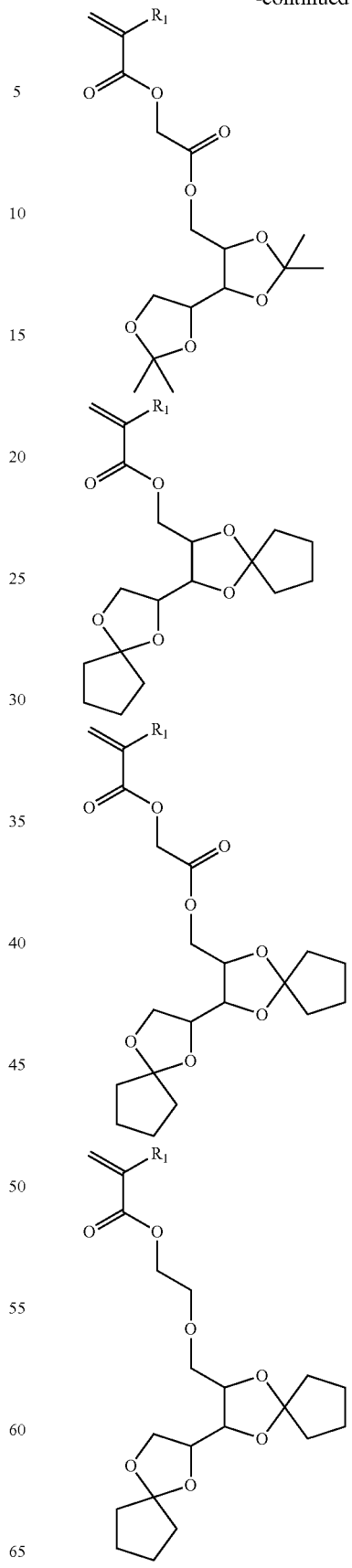

wherein $R_1$ is as defined above. The acid-labile group-containing unit is typically present in the matrix polymer in an amount of from 30 to 60 mol %.

The polymer preferably further includes a unit formed from a monomer comprising a lactone group. The lactone group-containing unit if used is typically present in the polymer in an amount of from 20 to 60 mol %. Suitable such lactone moieties are known in the art and include, for example, those of the following formulae:

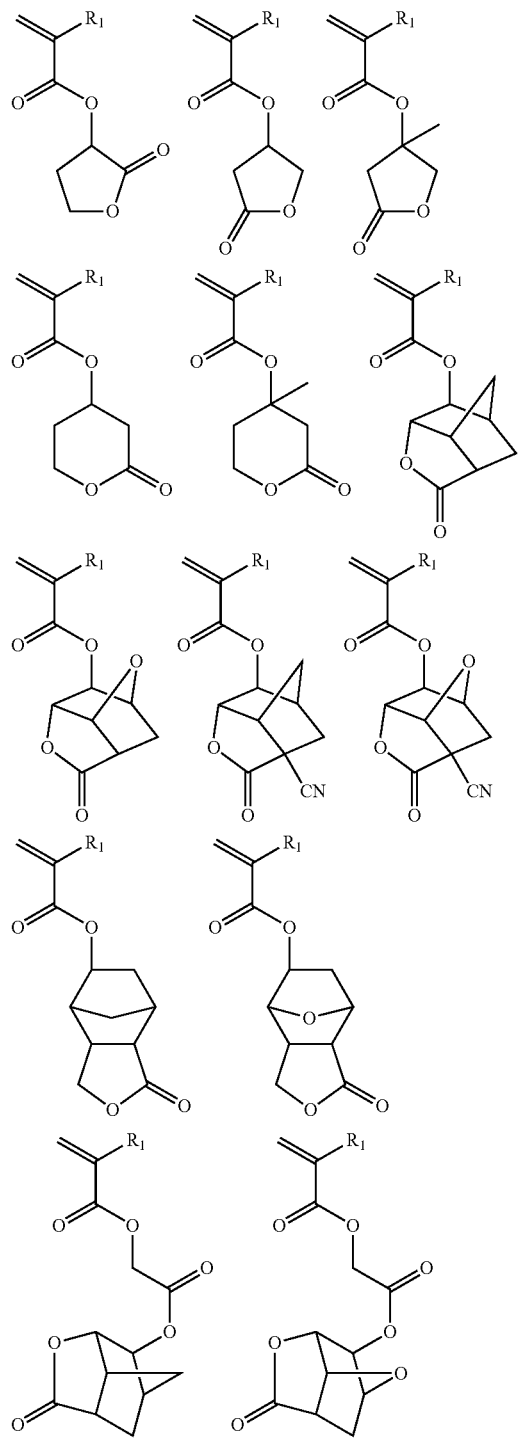

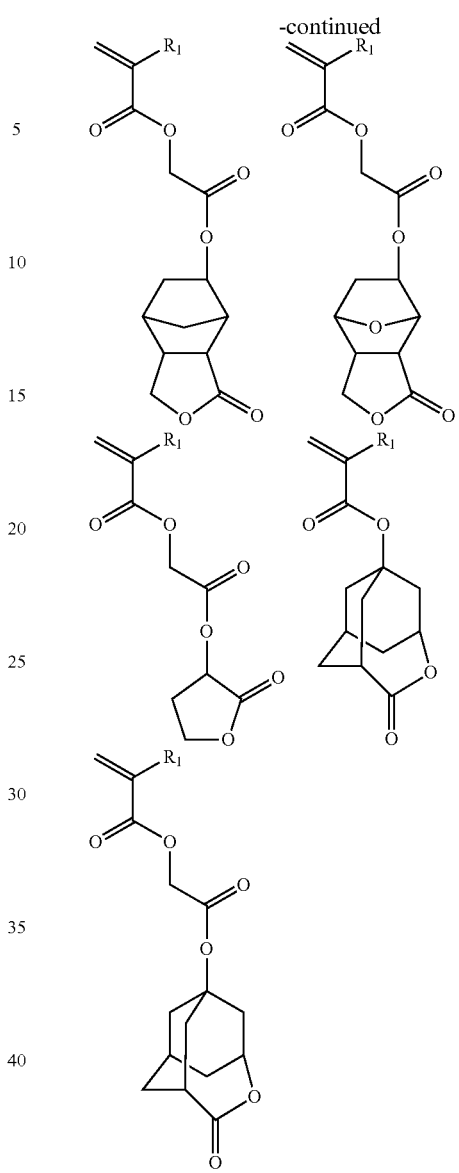

wherein $R_1$ is as defined above in general formula (I), as being chosen from hydrogen and C1 to C3 alkyl, preferably hydrogen or methyl. Suitable monomers for the second unit are commercially available and/or can be synthesized using known techniques.

Other suitable additional monomeric units for the polymer include, for example: monomeric units containing esters, such as 2-methyl-acrylic acid tetrahydro-furan-3-yl ester, 2-methyl-acrylic acid 2-oxo-tetrahydro-furan-3-yl ester, 2-methyl-acrylic acid 5-oxo-tetrahydro-furan-3-yl ester, 2-methyl-acrylic acid 3-oxo-4,10-dioxa-tricyclo[5.2.1.0²,⁶] dec-8-yl ester, 2-methyl-acrylic acid 3-oxo-4-oxa-tricyclo [5.2.1.0²,⁶]dec-8-yl ester, 2-methyl-acrylic acid 5-oxo-4-oxa-tricyclo[4.2.1.0³,⁷]non-2-yloxycarbonylmethyl ester, acrylic acid 3-oxo-4-oxa-tricyclo[5.2.1.0²,⁶]dec-8-yl ester, 2-methyl-acrylic acid 5-oxo-4-oxa-tricyclo[4.2.1.0³,⁷]non-2-yl ester, and 2-methyl-acrylic acid tetrahydro-furan-3-yl ester; and monomeric units having polar groups such as alcohols and fluorinated alcohols, such as 2-methyl-acrylic acid 3-hydroxy-adamantan-1-yl ester, 2-methyl-acrylic acid 2-hydroxy-ethyl ester, 6-vinyl-naphthalen-2-ol, 2-methyl-acrylic acid 3,5-dihydroxy-adamantan-1-yl ester, 2-methyl-acrylic acid 6-(3,3,3-trifluoro-2-hydroxy-2-trifluoromethyl-propyl)-bicyclo[2.2.1]hept-2-yl, and 2-bicyclo[2.2.1]hept-5-en- 2-ylmethyl-1,1,1,3,3,3-hexafluoro-propan-2-ol; and monomeric units containing ethers such as alkyl ethers. Suitable monomers for such additional units are commercially available and/or can be synthesized using known methods. The additional units are typically present in the matrix polymer in an amount of from 40 to 70 mol %.

For imaging at sub-200 nm wavelengths such as 193 nm, the polymer is typically substantially free (e.g., less than 15 mol %) of phenyl, benzyl or other aromatic groups where such groups are highly absorbing of the radiation. The polymer can contain repeat units that contain a hetero atom, particularly oxygen and/or sulfur, for example, one or more chosen from: heteroalicyclic units fused to the polymer backbone; fused carbon alicyclic units such as provided by polymerization of a norbornene group; and carbocyclic aryl units substituted with one or more hetero-atom-containing (e.g., oxygen or sulfur) groups, for example, hydroxy naphthyl groups.

Preferred polymers useful in the negative tone development methods of the invention include, for example, the following:

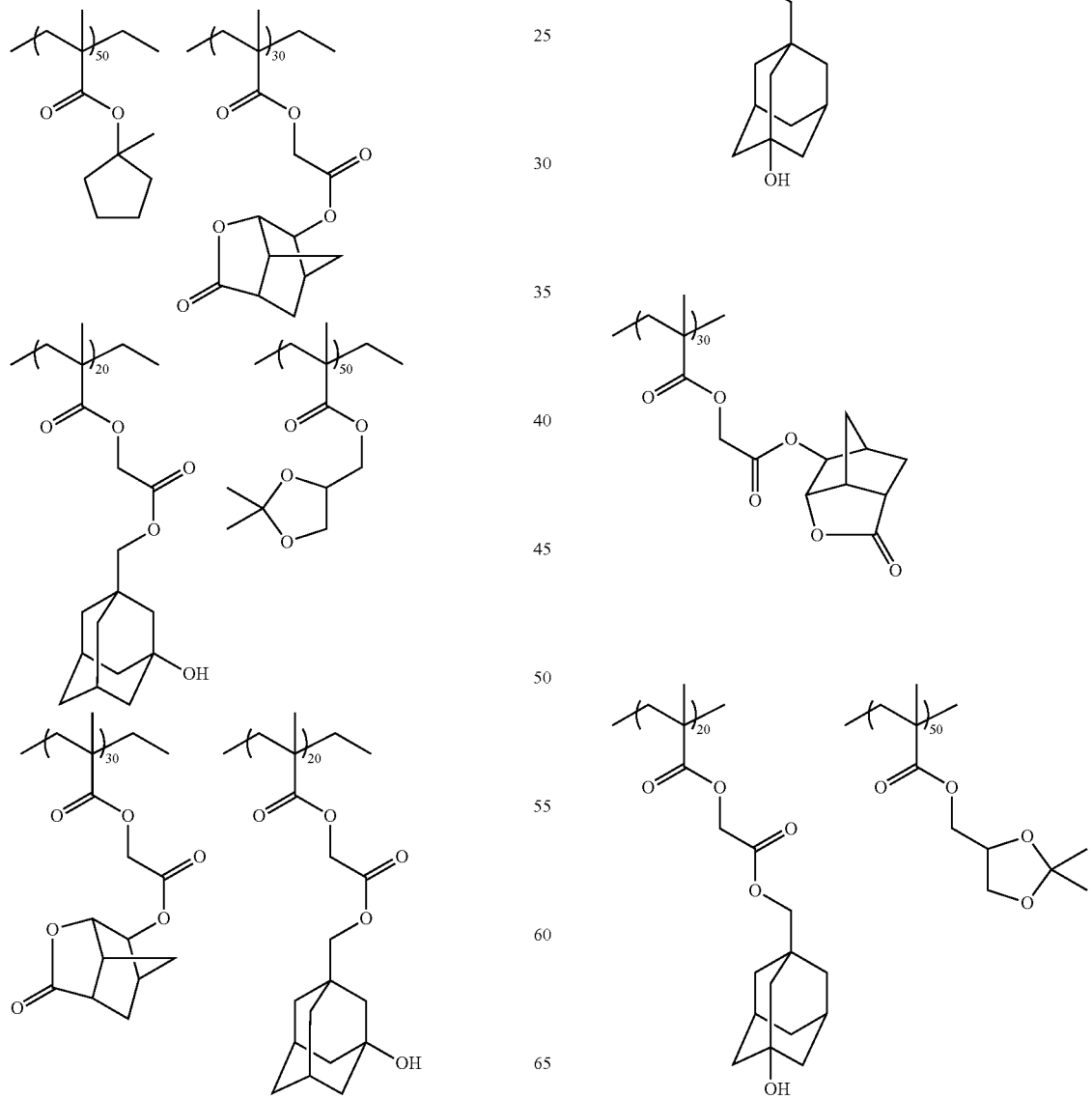

-continued

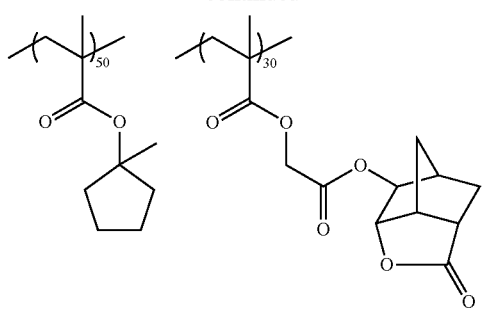

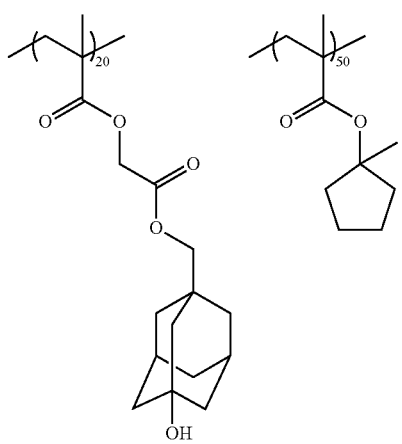

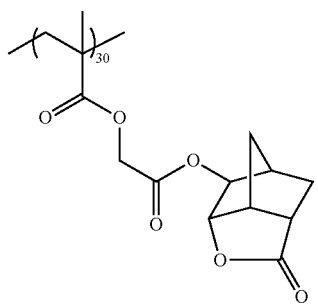

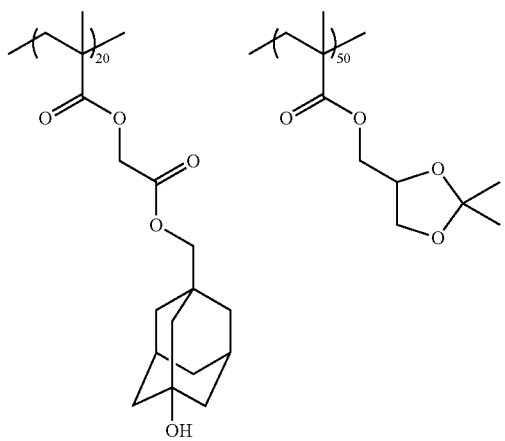

-continued

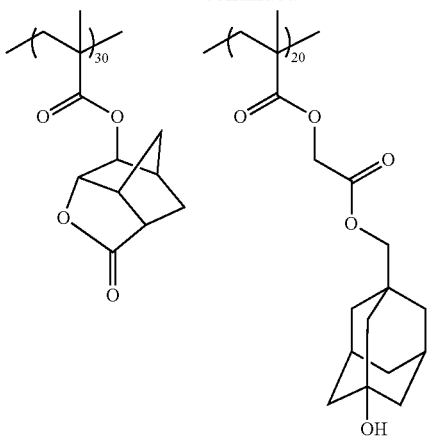
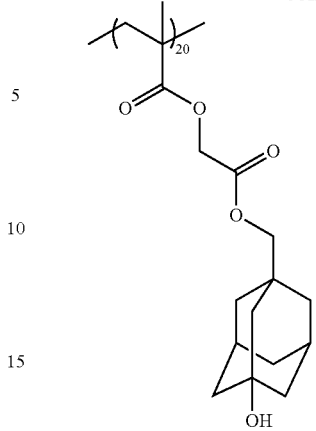
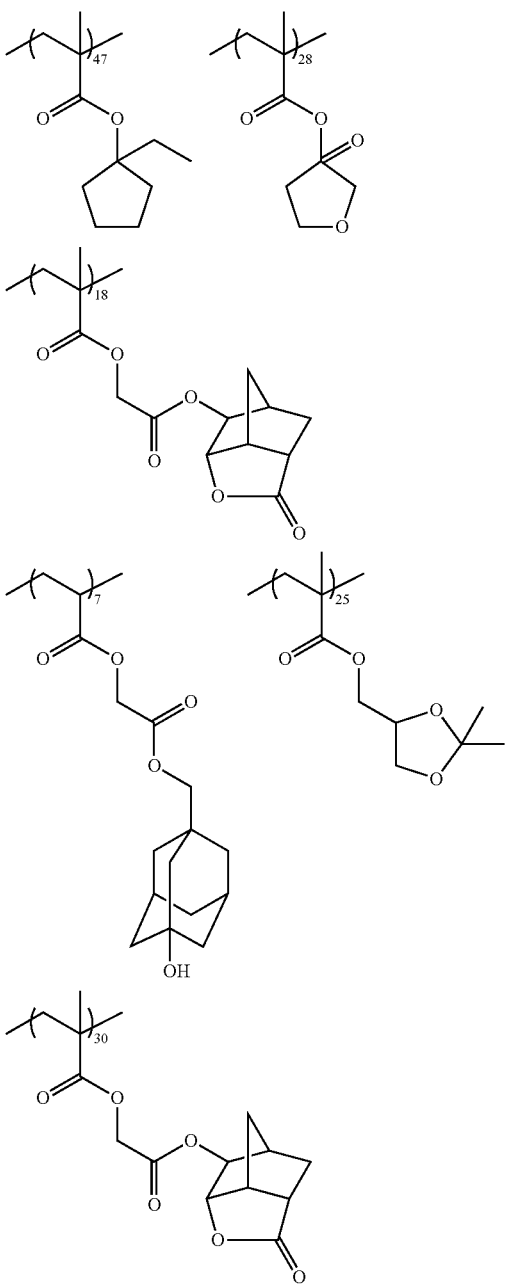

The weight average molecular weight $M_w$ of the polymers is typically less than 100,000, for example, from 5000 to 50,000, more typically from 6000 to 30,000 or from 8,000 to 20,000.

Suitable polymers can readily be synthesized by persons skilled in the art using known methods and commercially available starting materials. The polymers can be synthesized, for example, by first dissolving the polymerizable group-containing monomers in a suitable organic solvent, for example, tetrahydrofuran, dioxane, ethyl acetate, dimethyl formamide, propylene glycol methyl ether acetate (PGMEA), methylene chloride, chloroform, acetone, methyl ethyl ketone or the like, and degassing. A radical initiator can be dissolved in a suitable solvent which is the same or different from that used for the monomer dissolution, and then added to the monomer solution. Suitable radical initiators include, for example, 2,2'-azobisisobutyronitrile (AIBN), dimethyl 2,2'-azobis(2-methylpropionate) (Vazo™ 601, DuPont), 2,2'-azobis(2,4-dimethyl)valeronitrile (Vazo™ 52, DuPont) and 2,2-azobis(2-methylbutane-nitrile) (Vazo™ 67, DuPont). A reaction vessel is charged with a solvent which is the same or different from that used for the monomer solution and is heated to a temperature of from 40 to 140° C., typically from 70 to 80° C. The initiator solution can then be added to the reaction vessel, and the monomer solution added in a dropwise manner to the vessel. The reaction mixture can be cooled and slowly added to a rapidly stirred non-solvent for precipitation. Suitable non-solvents include, for example, water, alcohols, alkanes, ethers, and combinations thereof. The polymer is collected, optionally rinsed with a small amount of non-solvent and dried. For further purification, the polymer can be re-dissolved in a suitable solvent, precipitated and dried.

B. Photoacid Generator

The photosensitive composition further comprises a photoactive component such as a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris (trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

C. Solvent

Suitable solvents for the photoresist compositions include, for example: glycol ethers such as 2-methoxyethyl ether(diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

D. Other Components

The photoresist compositions can also include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of resist compositions of the invention is an added base, for example, a caprolactam, which can enhance resolution of a developed resist relief image. Other suitable basic additives include: alkyl amines such as tripropylamine and dodecylamine, aryl amines such as diphenylamine, triphenylamine, aminophenol, 2-(4-aminophenyl)-2-(4-hydroxyphenyl)propane, and the like. The added base is suitably used in relatively small amounts, for example, from 0.01 to 5 wt %, preferably from 0.1 to 2 wt %, based on total solids of the photoresist composition.

Surface active polymers can optionally be used as an additive in the photoresist formulation in order to simplify the immersion lithographic process by avoiding the need for a top-coat layer over the resist layer. Top-coat layers are typically used to prevent resist components such as photoacid generators from contaminating the imaging lens surface. Surface active polymer additives added to the photoresist formulations migrate to the surface during the coating process due to their relatively low surface free energy. The surface active polymer additives should have a lower surface free energy than the matrix polymer to allow the surface active polymer to migrate to the surface. A typical surface free energy of the surface active polymer additives is from 10 to 40 mJ/m$^2$. Suitable surface active polymers are known in the art and include, for example, those disclosed by Tsibouklis and Nevell (Advanced Materials, 2003, 15, pp. 647-650). Exemplary suitable polymer additives include, for example, poly(n-butyl acrylate), poly(n-butyl methacrylate), poly(i-butyl acrylate), poly(i-butyl methacrylate), poly(diethyl siloxane), poly(vinyl butyrate), polytetrahydrofuran, poly(propylene glycol), poly(tetramethylene oxide) and fluorinated polymers. The one or more additive polymer typically may be present in the photoresist composition in relatively small amounts and still provide effective results. The content of the additive polymer may depend, for example, on whether the lithography is a dry or immersion-type process. For example, the additive polymer lower limit for immersion lithography is generally dictated by the need to prevent leaching of the resist components. A higher additive polymer content will typically result in pattern degradation. The one or more polymer additive is typically present in the compositions of the invention in an amount of from 0.1 to 10 wt %, more typically from 1 to 5 wt %, based on total solids of the photoresist composition. The weight average molecular weight of the additive polymer is typically less than 400,000, for example from 5000 to 50,000.

Preparation of Photoresist Compositions

The photoresists are generally prepared following known procedures. For example, a photoresist composition of the invention can be prepared by dissolving the components of the photoresist in the solvent component. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Photoresist compositions of the invention find particular applicability in negative-tone development processes such as described below, but can be used in positive-tone development wherein exposed portions of the photoresist layer are removed in developer solutions.

Negative Tone Development Methods

Methods of the invention will now be described with reference to FIG. 1A-E, which illustrates an exemplary process flow for forming a photolithographic pattern by negative tone development. FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched may be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 104 and/or a bottom antireflective coating (BARC) 106 over which a photoresist layer 108 is to be coated. Use of a hard mask layer 104 may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer 104 can include a single layer or a plurality of layers of different materials. The hard mask layer can be formed, for example, by chemical or physical vapor deposition techniques.

A bottom antireflective coating 106 may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating 106 can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™ 40A and AR™ 124 antireflectant materials.

A photoresist composition as described herein is applied on the substrate over the antireflective layer 106 (if present) to form a photoresist layer 108. The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 108 is from about 500 to 3000 Å.

The photoresist layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 108 is next exposed to activating radiation 110 through a first photomask 112 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions 113, 114 corresponding to regions of the resist layer to remain and be removed, respectively, in a subsequent development step for a positive-acting material as illustrated. The exposure wavelength is typically sub-400 nm, sub-300 nm or sub-200 nm, with 248 nm and 193 nm being typical. The methods find use in immersion or dry (non-immersion) lithography techniques. The exposure energy is typically from about 10 to 80 mJ/cm$^2$, dependent upon the exposure tool and the components of the photosensitive composition.

Figure 1B:
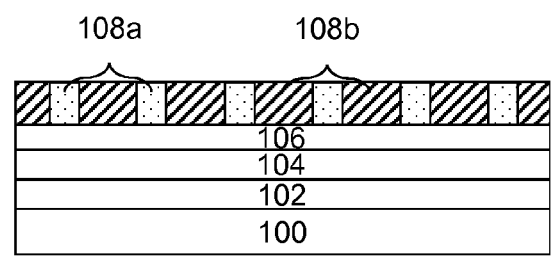

As shown in FIG. 1B, the exposed resist layer is made up of unexposed and exposed regions 108a, 108b. Following exposure of the photoresist layer 108, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds.

Figure 1C:
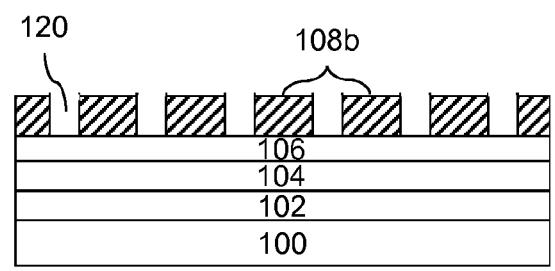

The exposed photoresist layer is next developed to remove unexposed regions 108a, leaving exposed regions 108b forming a resist pattern as shown in FIG. 1C. The developer is typically an organic developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Of these, 2-heptanone and 5-methyl-2-hexanone are particularly preferred. Other suitable solvents include those used in the photoresist composition.

The solvent can be present in the developer as a substantially pure material, for example, in an amount greater than 95 wt %, greater than 98 wt % or greater than 99 wt %, based on the total weight of the developer. In the case a mixture of solvents are used in the developer, the boiling points of the solvents are preferably similar. The solvents of the developer are typically present in an amount of from 50 wt % to 100 wt %, more typically from 80 wt % to 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a time of from 5 to 30 seconds being typical. Development is typically conducted at room temperature. The development process can be conducted without use of a cleaning rinse following development. In this regard, it has been found that the development process can result in a residue-free wafer surface rendering such extra rinse step unnecessary.

Figure 1D:
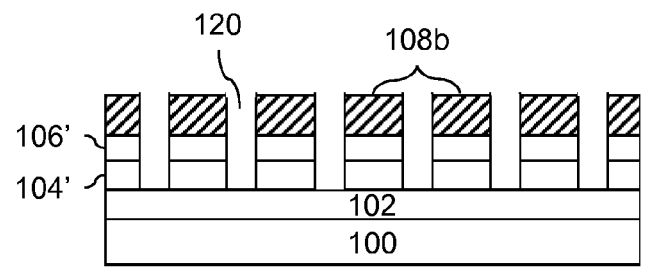

The BARC layer 106, if present, is selectively etched using resist pattern 108b as an etch mask, exposing the underlying hardmask layer 104. The hardmask layer is next selectively etched, again using the resist pattern 108b as an etch mask, resulting in patterned BARC and hardmask layers 106', 104', as shown in FIG. 1D. Suitable etching techniques and chemistries for etching the BARC layer and hardmask layer are known in the art and will depend, for example, on the particular materials of these layers. Dry-etching processes such as reactive ion etching are typical. The resist pattern 108b and patterned BARC layer 106' are next removed from the substrate using known techniques, for example, oxygen plasma ashing.

Figure 1E:
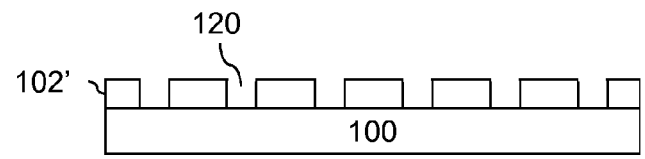

Using the hardmask pattern 104' as an etch mask, the one or more layers 102 are selectively etched. Suitable etching techniques and chemistries for etching the underlying layers 102 are known in the art, with dry-etching processes such as reactive ion etching being typical. The patterned hardmask layer 104' can next be removed from the substrate surface using known techniques, for example, a dry-etching process such as reactive ion etching. The resulting structure is a pattern of etched features 102' as illustrated in FIG. 1E. In an alternative exemplary method, it may be desirable to pattern the layer 102 directly using the resist pattern 108b without the use of a hardmask layer 104. Whether direct patterning is employed will depend on factors such as the materials involved, resist selectivity, resist pattern thickness and pattern dimensions.

The negative tone development methods of the invention are not limited to the exemplary methods described above. For example, the photoresist compositions described herein can be used in a negative tone development double exposure method for making contact holes. An exemplary such process is a variation of the technique described with reference to FIG. 1, but using an additional exposure of the photoresist layer in a different pattern than the first exposure. In this process, the photoresist layer is exposed to actinic radiation through a photomask in a first exposure step. The photomask includes a series of parallel lines forming the opaque regions of the mask. Following the first exposure, a second exposure of the photoresist layer is conducted through a second photomask that includes a series of lines in a direction perpendicular to those of the first photomask. The resulting photoresist layer includes unexposed regions, once-exposed regions and twice-exposed regions.

Following the second exposure, the photoresist layer is post-exposure baked and developed using a developer as described above. Unexposed regions corresponding to points of intersection of the lines of the two masks are removed, leaving behind the once- and twice-exposed regions of the resist. The resulting structure can next be patterned as described above with reference to FIG. 1. This method is particularly suited to formation of contact holes in the manufacture of electronic devices.

EXAMPLES

Monomers used in the following examples and their abbreviations are as follows:

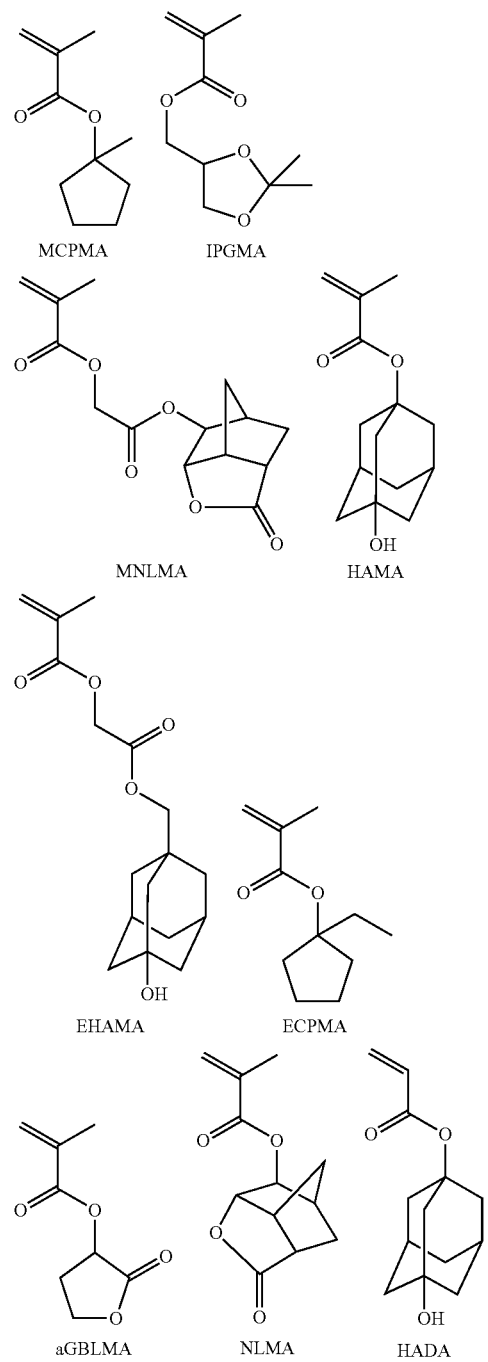

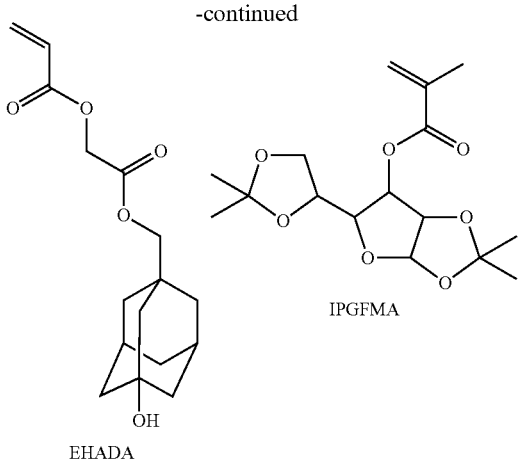

EHADA · IPGFMA

Monomer Synthesis

Example 1

2-((3-Hydroxyadamantan-1-yl)methoxy)-2-oxoethyl methacrylate (EHAMA)

3-(hydroxymethyl)adamantan-1-ol (120.0 g, 0.66 mol) (Aldrich Chemicals) and triethyl amine (303.3 g, 3.0 mol) were slowly combined in dichloromethane (1200 mL) at room temperature. This solution was cooled to 0° C. with stirring. To this reaction mixture, 2-chloroacetyl chloride (75.0 g, 0.66 mol) was added dropwise over 30 minutes. This solution was stirred vigorously at room temperature overnight, and the resulting solution was filtered. The organic phase was washed with high purity water (3×200 mL) and dried over anhydrous $MgSO_4$ The resulting oil was concentrated under high vacuum (0.3 torr) at room temperature for 3 hours, and was cooled in a refrigerator at −20° C. overnight. A pale brown solid was obtained 135.5 g (79% yield) having the following nmr spectrum characteristics: $^1H$ NMR (300 MHz) δ 1.49 (br, 4H), 1.55 (br, 2H), 1.61 (br, 2H), 1.71 (br, 4H), 2.34 (br, 2H), 3.90 (s, 2H), 4.11 (s, 2H).

The resulting solid (60.0 g, 0.23 mol) was dissolved in triethyl amine (60.0 g, 0.60 mol) and dichloromethane (750 mL) at 0° C. Methacrylic acid (20.0 g, 0.23 mol) was added dropwise over 1 hour. The reaction mixture was stirred at 42° C. for 60 hours. The resulting solution was filtered. The organic phase was washed with high purity water (3×150 mL). 1,4-hydroquinone (16.0 mg) was added as an inhibitor. Solvent was removed under vacuum, with the temperature of the water bath being kept under 25° C. during the process. The resulting oil was passed through a silica gel plug (30 cm×10 cm) with ethyl acetate as the eluent. 1,4-hydroquinone (16.0 mg) was added. Solvent was removed under vacuum. A pale brown oil was obtained 66.0 g (91% yield) having the following proton nmr spectrum characteristics: $^1H$ NMR (300 MHz) 1.43 (br, 4H), 1.48 (br, 2H), 1.55 (br, 2H), 1.67 (br, 4H), 2.21 (br, 2H), 3.83 (s, 2H), 4.70 (s, 2H), 5.66 (s, 1H), 6.22 (s, 1H); $^{13}C$ NMR (75.5 MHz, $CDCl_3$) δ 18.5, 30.4, 35.6, 37.2, 38.0, 44.8, 46.9, 61.1, 68.6, 73.7, 127.2, 135.6, 166.9, 168.1. EHAMA monomer was thereby synthesized.

Example 2

2-((3-Hydroxyadamantan-1-yl)methoxy)-2-oxoethyl acrylate (EHADA)

The same pale brown solid described in Example 1 was used in preparation of the HADA monomer. This solid (30.0 g, 0.12 mol) was dissolved in triethyl amine (24.0 g, 0.24 mol) and dichloromethane (500 mL) at 0° C. Acrylic acid (8.4 g, 0.12 mol) was added dropwise over 15 minutes. The reaction mixture was stirred at 40° C. for 3 days. The resulting solution was filtered. The organic phase was washed with high purity water (3×50 mL). 1,4-hydroquinone (8.0 mg) was added as an inhibitor. Solvent was removed under vacuum, with the temperature of the water bath being kept under 25° C. during the process. The resulting oil was passed through a silica gel plug (30 cm×10 cm) with methylene chloride as the first eluent to remove the colored impurities. Ethyl acetate was used as the second eluent to wash down the product. 1,4-hydroquinone (10.0 mg) was added. Solvent was removed under vacuum. A pale brown oil was obtained 22.0 g (64% yield) having the following proton nmr spectrum characteristics: $^1H$ NMR (300 MHz) 1.43 (br, 4H), 1.49 (br, 2H), 1.57 (br, 2H), 1.67 (br, 4H), 3.85 (s, 2H), 4.72 (s, 2H), 5.97 (d, 1H), 6.23 (m, 1H), 6.49 (d, 1H); $^{13}C$ NMR (75.5 MHz, $CDCl_3$) δ 30.4, 35.6, 37.2, 38.0, 44.8, 46.8, 61.0, 68.7, 73.8, 127.6, 132.7, 165.7, 168.1. EHADA monomer was thereby synthesized.

Matrix Polymer Synthesis

Example 3 (Comparative)

Synthesis of poly(IPGMA/NLMA/HAMA) (50/30/20)

Monomers of IPGMA (17.307 g), NLMA (11.526 g), and HAMA (8.167 g) were dissolved in 55 g of PGMEA. The monomer solution was degassed by bubbling with nitrogen for 20 min. PGMEA (26.220 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azo-diisobutyrate) (1.194 g) was dissolved in 7.4 g of PGMEA and the initiator solution was degassed by bubbling with nitrogen for 20 min. The initiator solution was added into the reaction flask and then monomer solution was fed into the reactor dropwise over the 3 hrs period under rigorous stirring and nitrogen environment. After monomer feeding was complete, the polymerization mixture was left standing for an additional hour at 80° C. After a total of 4 hrs of polymerization time (3 hrs of feeding and 1 hr of post-feeding stirring), the polymerization mixture was allowed to cool down to room temperature. Precipitation was carried out in methyl tert-butyl ether (MTBE) (1528 g). The power precipitated was collected by filtration, air-dried overnight, re-dissolved in 111 g of THF, and re-precipitated into MTBE (1528 g). The final polymer was filtered, air-dried overnight and further dried under vacuum at 60° C. for 48 hrs to give "Polymer A" (Yield: 75%, Mw: 13.744 and PDI: 1.61).

Example 4

Synthesis of poly(IPGMA/NLMA/EHAMA) (50/30/20)

Monomers of IPGMA (17.529 g), NLMA (11.673 g), and EHAMA (10.798 g) were dissolved in 60 g of PGMEA. The monomer solution was degassed by bubbling with nitrogen for 20 min. PGMEA (28.626 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azo-diisobutyrate) (1.411 g) was dissolved in 8 g of PGMEA and the initiator solution was degassed by bubbling with nitrogen for 20 min. The initiator solution was added into the reaction flask and then monomer solution was fed into the reactor dropwise over the 3 hrs period under rigorous stirring and nitrogen environment. After monomer feeding was complete, the polymerization mixture was left standing for an additional hour at 80° C. After a total of 4 hrs of polymerization time (3 hrs of feeding and 1 hr of post-feeding stirring), the polymerization mixture was allowed to cool down to room temperature. Precipitation was carried out in methyl tert-butyl ether (MTBE) (1656 g). The power precipitated was collected by filtration, air-dried overnight, re-dissolved in 120 g of THF, and re-precipitated into MTBE (1656 g). The final polymer was filtered, air-dried overnight and further dried under vacuum at 60° C. for 48 hrs to give "Polymer B" (Yield: 70%, Mw: 13.459 and PDI: 1.63).

Example 5 (Comparative)

Synthesis of poly(ECPMA/aGBLMA/MNLMA) (40/20/40)

Monomers of ECPMA (13.313 g), aGBLMA (6.215 g), and MNLMA (20.472 g) were dissolved in 60 g of PGMEA. The monomer solution was degassed by bubbling with nitrogen for 20 min. PGMEA (32.201 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (2.943 g) was dissolved in 8 g of PGMEA and the initiator solution was degassed by bubbling with nitrogen for 20 min. The initiator solution was added into the reaction flask and then monomer solution was fed into the reactor dropwise over the 3 hrs period under rigorous stirring and nitrogen environment. After monomer feeding was complete, the polymerization mixture was left standing for an additional hour at 80° C. After a total of 4 hrs of polymerization time (3 hrs of feeding and 1 hr of post-feeding stirring), the polymerization mixture was allowed to cool down to room temperature. Precipitation was carried out in methyl tert-butyl ether (MTBE) (1718 g). The power precipitated was collected by filtration, air-dried overnight, re-dissolved in 120 g of THF, and re-precipitated into MTBE (1718 g). The final polymer was filtered, air-dried overnight and further dried under vacuum at 60° C. for 48 hrs to give "Polymer C" (Yield: 80%, Mw: 8.464 and PDI: 1.47).

Example 6

Synthesis of poly(ECPMA/aGBLMA/MNLMA/EHAMA) (40/20/20/20)

Monomers of ECPMA (12.980 g), aGBLMA (6.059 g), MNLMA (9.980 g) and EHAMA (10.981 g) were dissolved in 60 g of PGMEA. The monomer solution was degassed by bubbling with nitrogen for 20 min. PGMEA (32.030 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (2.870 g) was dissolved in 8 g of PGMEA and the initiator solution was degassed by bubbling with nitrogen for 20 min. The initiator solution was added into the reaction flask and then monomer solution was fed into the reactor dropwise over the 3 hrs period under rigorous stirring and nitrogen environment. After monomer feeding was complete, the polymerization mixture was left standing for an additional hour at 80° C. After a total of 4 hrs of polymerization time (3 hrs of feeding and 1 hr of post-feeding stirring), the polymerization mixture was allowed to cool down to room temperature. Precipitation was carried out in methyl tert-butyl ether (MTBE) (1715 g). The power precipitated was collected by filtration, air-dried overnight, re-dissolved in 120 g of THF, and re-precipitated into MTBE (1715 g). The final polymer was filtered, air-dried overnight and further dried under vacuum at 60° C. for 48 hrs to give "Polymer D" (Yield: 58%, Mw: 9.155 and PDI: 1.40).

Example 7 (Comparative)

Synthesis of poly(MCPMA/MNLMA/HADA) (50/30/20)

Monomers of MCPMA (79.110 g), MNLMA (79.078 g), and HADA (41.811 g) were dissolved in 300 g of PGMEA. The monomer solution was degassed by bubbling with nitrogen for 20 min. PGMEA (151.933 g) was charged into a 1000 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (10.828 g) was dissolved in 40 g of PGMEA and the initiator solution was degassed by bubbling with nitrogen for 20 min. The initiator solution was added into the reaction flask and then monomer solution was fed into the reactor dropwise over the 3 hrs period under rigorous stirring and nitrogen environment. After monomer feeding was complete, the polymerization mixture was left standing for an additional hour at 80° C. After a total of 4 hrs of polymerization time (3 hrs of feeding and 1 hr of post-feeding stirring), the polymerization mixture was allowed to cool down to room temperature. Precipitation was carried out in methyl tert-butyl ether (MTBE) (8433 g). The powder precipitated was collected by filtration, air-dried overnight, re-dissolved in 600 g of THF, and re-precipitated into MTBE (8433 g). The final polymer was filtered, air-dried overnight and further dried under vacuum at 60° C. for 48 hrs to give "Polymer E" (Yield: 69%, Mw: 10,904 and PDI: 1.51).

Example 8 (Comparative)

Synthesis of poly(MCPMA/MNLMA/HAMA) (50/30/20)

Monomers of MCPMA (78.080 g), MNLMA (78.049 g), and HAMA (43.871 g) were dissolved in 300 g of PGMEA. The monomer solution was degassed by bubbling with nitrogen for 20 min. PGMEA (151.604 g) was charged into a 1000 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (10.687 g) was dissolved in 40 g of PGMEA and the initiator solution was degassed by bubbling with nitrogen for 20 min. The initiator solution was added into the reaction flask and then monomer solution was fed into the reactor dropwise over the 3 hrs period under rigorous stirring and nitrogen environment. After monomer feeding was complete, the polymerization mixture was left standing for an additional hour at 80° C. After a total of 4 hrs of polymerization time (3 hrs of feeding and 1 hr of post-feeding stirring), the polymerization mixture was allowed to cool down to room temperature. Precipitation was carried out in methyl tert-butyl ether (MTBE) (8427 g). The powder precipitated was collected by filtration, air-dried overnight, re-dissolved in 600 g of THF, and re-precipitated into MTBE (8427 g). The final polymer was filtered, air-dried overnight and further dried under vacuum at 60° C. for 48 hrs to give "Polymer F" (Yield: 73%, Mw: 10,535 and PDI: 1.46).

Example 9 (Comparative)

Synthesis of poly(IPGMA/IPGFMA/MNLMA/HAMA) (25/25/30/20)

Monomers of IPGMA (7.600 g), IPGFMA (12.460 g), MNLMA (12.765 g), and HAMA (7.175 g) were dissolved in 60 g of PGMEA. The monomer solution was degassed by bubbling with nitrogen for 20 min. PGMEA (28.596 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (1.398 g) was dissolved in 8 g of PGMEA and the initiator solution was degassed by bubbling with nitrogen for 20 min. The initiator solution was added into the reaction flask and then monomer solution was fed into the reactor dropwise over the 3 hrs period under rigorous stirring and nitrogen environment. After monomer feeding was complete, the polymerization mixture was left standing for an additional hour at 80° C. After a total of 4 hrs of polymerization time (3 hrs of feeding and 1 hr of post-feeding stirring), the polymerization mixture was allowed to cool down to room temperature. Precipitation was carried out in methyl tert-butyl ether (MTBE) (1656 g). The power precipitated was collected by filtration, air-dried overnight, re-dissolved in 120 g of THF, and re-precipitated into MTBE (1656 g). The final polymer was filtered, air-dried overnight and further dried under vacuum at 60° C. for 48 hrs to give "Polymer G" (Yield: 69%, Mw: 13,639 and PDI: 1.58).

Example 10

Synthesis of poly(MCPMA/MNLMA/EHADA) (50/30/20)

Monomers of MCPMA (11.113 g), MNLMA (11.109 g), and EHADA (7.778 g) were dissolved in 45 g of PGMEA. The monomer solution was degassed by bubbling with nitrogen for 20 min. PGMEA (22.549 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (1.521 g) was dissolved in 6 g of PGMEA and the initiator solution was degassed by bubbling with nitrogen for 20 min. The initiator solution was added into the reaction flask and then monomer solution was fed into the reactor dropwise over the 3 hrs period under rigorous stirring and nitrogen environment. After monomer feeding was complete, the polymerization mixture was left standing for an additional hour at 80° C. After a total of 4 hrs of polymerization time (3 hrs of feeding and 1 hr of post-feeding stirring), the polymerization mixture was allowed to cool down to room temperature. Precipitation was carried out in methyl tert-butyl ether (MTBE) (1261 g). The power precipitated was collected by filtration, air-dried overnight, re-dissolved in 90 g of THF, and re-precipitated into MTBE (1261 g). The final polymer was filtered, air-dried overnight and further dried under vacuum at 60° C. for 48 hrs to give "Polymer H" (Yield: 64%, Mw: 11,504 and PDI: 1.51).

Example 11

Synthesis of poly(MCPMA/MNLMA/EHAMA) (50/30/20)

Monomers of MCPMA (14.637 g), MNLMA (14.631 g), and EHAMA (10.732 g) were dissolved in 60 g of PGMEA. The monomer solution was degassed by bubbling with nitrogen for 20 min. PGMEA (30.008 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (2.0038 g) was dissolved in 8 g of PGMEA and the initiator solution was degassed by bubbling with nitrogen for 20 min. The initiator solution was added into the reaction flask and then monomer solution was fed into the reactor dropwise over the 3 hrs period under rigorous stirring and nitrogen environment. After monomer feeding was complete, the polymerization mixture was left standing for an additional hour at 80° C. After a total of 4 hrs of polymerization time (3 hrs of feeding and 1 hr of post-feeding stirring), the polymerization mixture was allowed to cool down to room temperature. Precipitation was carried out in methyl tert-butyl ether (MTBE) (1680 g). The power precipitated was collected by filtration, air-dried overnight, re-dissolved in 120 g of THF, and re-precipitated into MTBE (1680 g). The final polymer was filtered, air-dried overnight and further dried under vacuum at 60° C. for 48 hrs to give "Polymer I" (Yield: 63%, Mw: 11,211 and PDI: 1.52).

Example 12

Synthesis of poly(IPGMA/IPGFMA/MNLMA/EHAMA) (25/25/20/30)

Monomers of IPGMA (7.205 g), IPGFMA (11.816 g), MNLMA (12.102 g), and EHAMA (8.877 g) were dissolved in 60 g of PGMEA. The monomer solution was degassed by bubbling with nitrogen for 20 min. PGMEA (28.427 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (1.326 g) was dissolved in 8 g of PGMEA and the initiator solution was degassed by bubbling with nitrogen for 20 min. The initiator solution was added into the reaction flask and then monomer solution was fed into the reactor dropwise over the 3 hrs period under rigorous stirring and nitrogen environment. After monomer feeding was complete, the polymerization mixture was left standing for an additional hour at 80° C. After a total of 4 hrs of polymerization time (3 hrs of feeding and 1 hr of post-feeding stirring), the polymerization mixture was allowed to cool down to room temperature. Precipitation was carried out in methyl tert-butyl ether (MTBE) (1653 g). The power precipitated was collected by filtration, air-dried overnight, re-dissolved in 120 g of THF, and re-precipitated into MTBE (1653 g). The final polymer was filtered, air-dried overnight and further dried under vacuum at 60° C. for 48 hrs to give "Polymer J" (Yield: 70%, Mw: 14,619 and PDI: 1.62).
Photoresist Composition Preparation

Example 13

11.2 g of a 2 wt % solution of PAG A (shown below) dissolved in methyl-2-hydroxyisobutyrate was added to 1.323 g of Polymer A. 2.105 g of a 1 wt % solution of dodecyldiethanolamine dissolved in PGMEA was added to the mixture. 0.64 g of a 1 wt % solution of P(nBMA$_{25}$/iBMA$_{75}$) in PGMEA was next added, followed by 20.782 g of PGMEA, 1.452 g of gamma valero lactone and 12.498 g of methyl-2-hydroxyisobutyrate. The resulting mixture was rolled on a roller for six hours and then filtered through a Teflon filter having a 0.2 micron pore size.

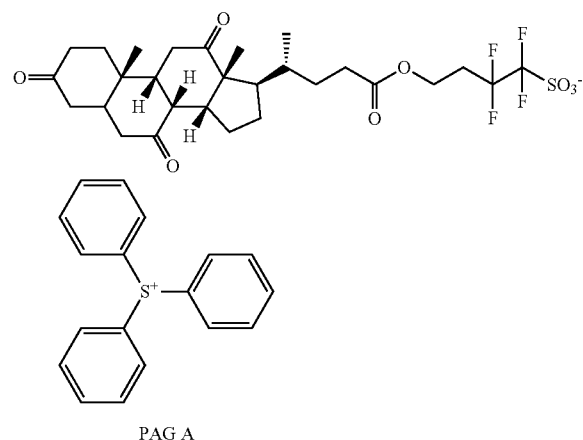

PAG A

Examples 14-22

Additional formulations were prepared using the same procedure described above for Polymer A except with the components and amounts set forth in Table 1.

TABLE 1

| Photoresist Example | Matrix Polymer | PAG A (wt %) | Quencher (Content wt %) | $E_{th}$ (mJ/cm$^2$) |
|---|---|---|---|---|
| 13 (Comp) | A | 14 (11.2 g) | DDEA (1.32) | 2.5 |
| 14 | B | 14 | DDEA (1.32) | 6.0 |
| 15 (Comp) | C | 16 | TB-Tris (0.41) | 4.4 |
| 16 | D | 16 | TB-Tris (0.41) | 7.4 |
| 17 (Comp) | E | 16 | TBOC-4HP (0.37) | 11.4 |
| 18 (Comp) | F | 16 | TBOC-4HP (0.37) | 10.6 |
| 19 (Comp) | G | 14 | DDEA (1.2) | 8.4 |
| 20 | H | 16 | TBOC-4HP (0.37) | 14.2 |
| 21 | I | 16 | TBOC-4HP (0.37) | 14.2 |
| 22 | J | 14 | DDEA (1.2) | 8.4 |

TBOC = tert-butyl 4-hydroxypiperidine-1-carboxylate; DDEA = 2,2'-(dodecylazanediyl)diethanol; TB-Tris = tert-butyl 1,3-dihydroxy-2-(hydroxymethyl)propan-2-ylcarbamate.

Dry Lithographic Contrast Evaluation

Silicon wafers were spin-coated with AR™ 77 bottom-antireflective coating (BARC) material (Rohm and Haas Electronic Materials) and baked for 60 seconds at 205° C. to yield a film thickness of 840 Å. The photoresist compositions were coated on the BARC-coated wafers and soft-baked at 90° C. for 60 seconds on a TEL CleanTrack ACT 8 coater/developer to provide a resist layer having a thickness of 900 Å.

The photoresist-coated wafers were then exposed through a blank mask with a 0.75 NA and a Quadrapole 30 illumination condition with 0.89 outer sigma and 0.64 inner sigma. The exposures were carried out with a starting dose of 1.0 mJ/cm$^2$ in increments of 0.2 mJ/cm$^2$ to expose 100 die in a 10×10 array on the wafers to cover a dose range from 1.0 to 20.8 mJ/cm$^2$. The exposed wafers were post-exposure baked at a temperature of 100° C. for 60 seconds and then developed with a 2-heptanone developer for 25 seconds on a TEL CleanTrack ACT 8 coater/developer. The remaining film thickness for different exposure doses was measured on a ThermaWave Optiprobe (KLA-Tencor) and NTD contrast curves were generated by plotting remaining film thickness as a function of exposure energy. The contrast curves are illustrated in FIGS. 2-6. From the contrast curves, the threshold energy ($E_{th}$) was determined for each photoresist composition as the minimum energy to reach constant film thickness and used as a measure of photosensitivity of each photoresist composition for the NTD process. This data is summarized in Table 1.

Figure 2:
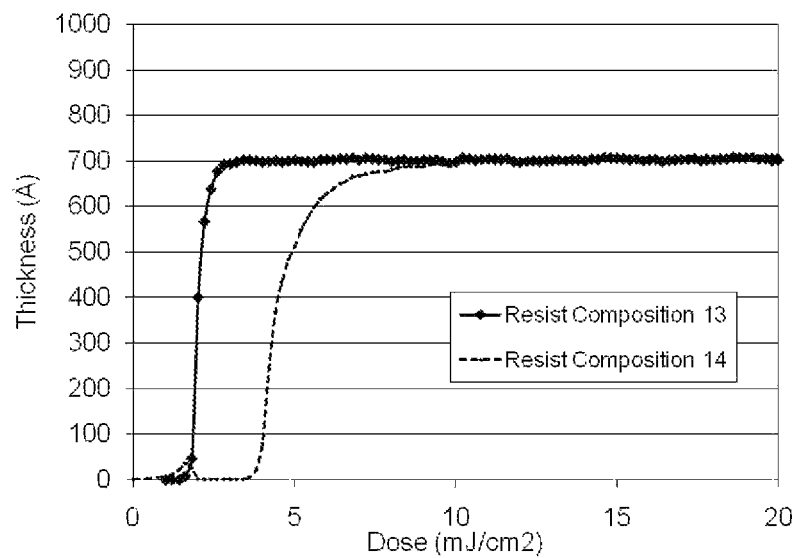
FIGS. 2-6 provide contrast curves for photoresist compositions described in the examples.
Figure 3:
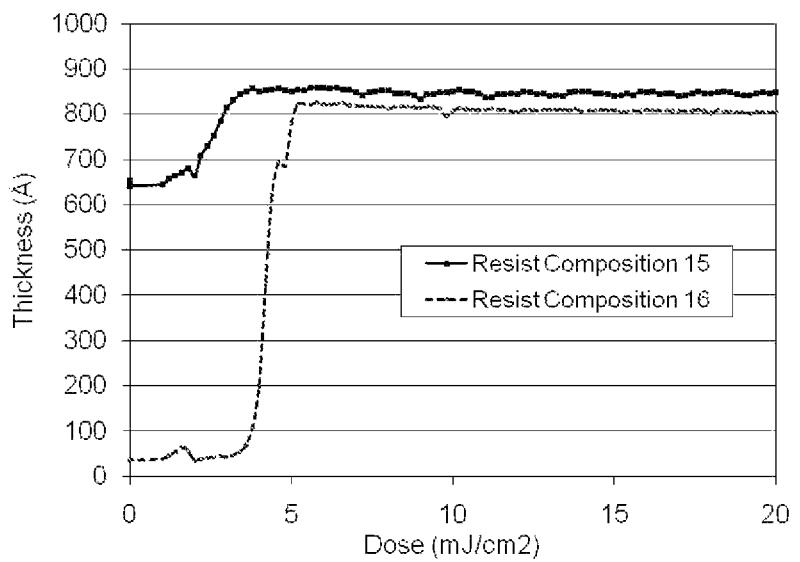
Figure 4:
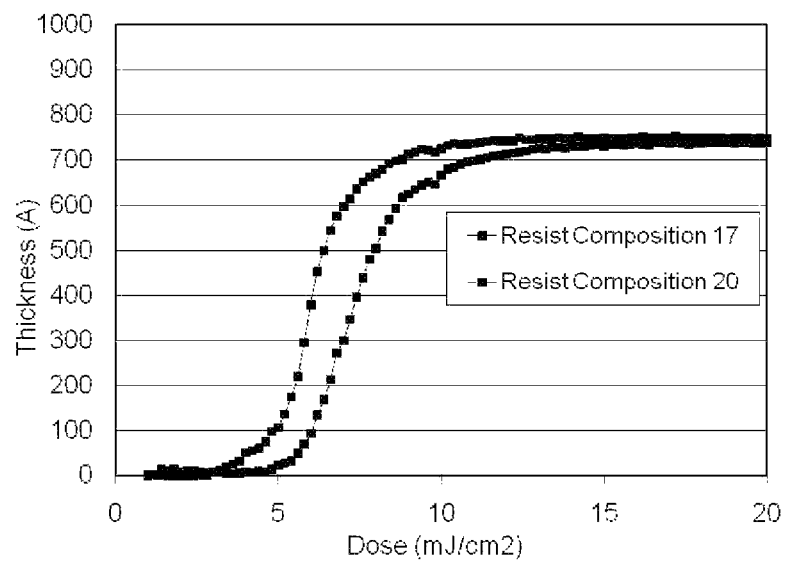
Figure 5:
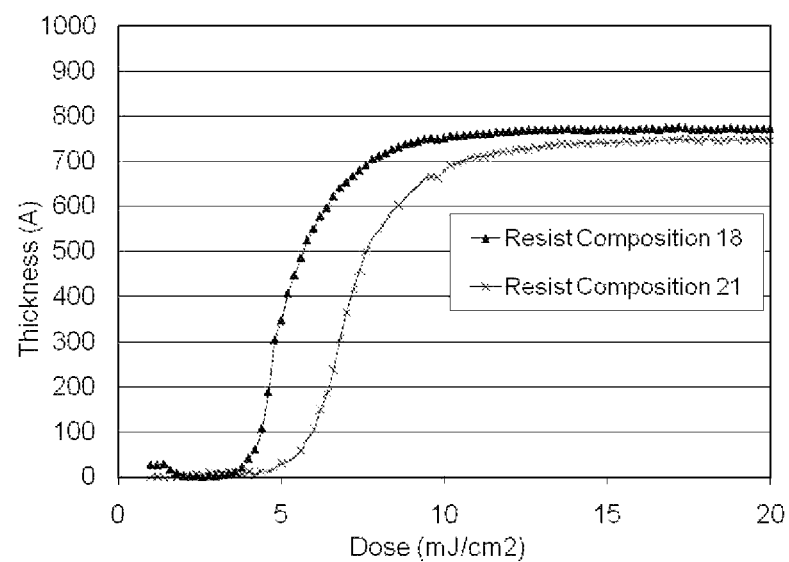
Figure 6:
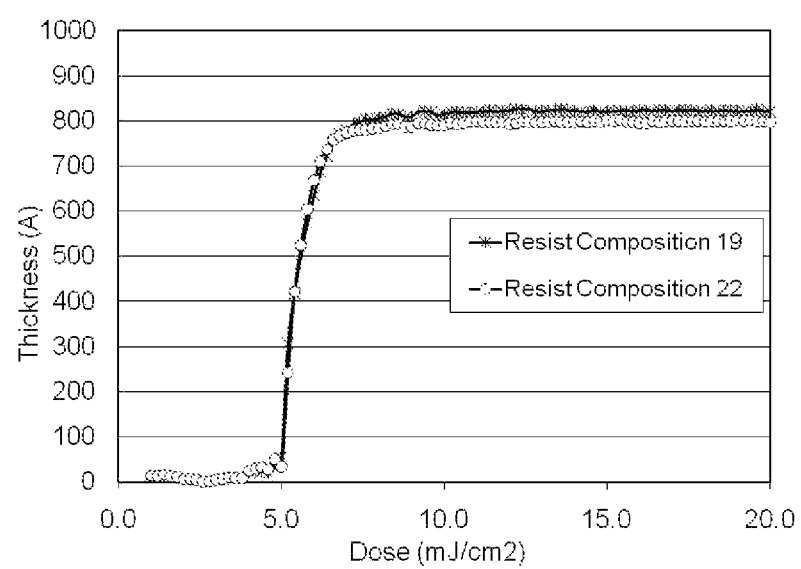

FIG. 2 provides contrast curves for the photoresist compositions of Examples 13 and 14, comparing the effect of the polar group HAMA with the polar group EHAMA, respectively. The HAMA-containing polymer and resist composition of Comparative Example 13 exhibited a relatively low solubility in organic developer and fast photospeed with $E_{th}$ value of 2.5 mJ/cm$^2$, in comparison to the EHAMA-containing polymer of Example 14, which exhibited an $E_{th}$ value of 6.0 mJ/cm$^2$. FIG. 3 provides contrast curves for the photoresist compositions of Comparative Example 15 and Example 16, comparing the effect of a polymer without and with the polar group EHAMA, respectively. The composition without the EHAMA group exhibited a relatively low solubility in organic developer even at an exposure energy of 1 mJ/cm$^2$, resulting in a very fast photospeed with an $E_{th}$ of 4.4 mJ/cm$^2$. The EHAMA-containing formulation of Example 16 was completely soluble and exhibited an $E_{th}$ value at 7.4 mJ/cm$^2$. FIGS. 4-7 provide additional contrast curves for the other photoresist compositions, comparing the effect of the polar groups HADA with EHADA or HAMA with EHAMA.

Immersion Lithographic Processing

Examples 23 and 24

300 mm silicon wafers were spin-coated with AR™ 26N antireflectant (Rohm and Haas Electronic Materials) to form a first bottom antireflective coating (BARC) on a TEL CLEAN TRAC LITHIUS i+ coater/developer. The wafers were baked for 60 seconds at 240° C., yielding a first BARC film thickness of 760 Å. A second, silsesquioxane-containing, BARC layer was next coated over the first BARC, and was baked at 240° C. for 60 seconds to generate a 390 Å top BARC layer. Photoresist formulations of Examples 13 and 14 were coated on the dual BARC-coated wafers and soft-baked at 90° C. for 60 seconds on a TEL CLEAN TRACK LITHIUS i+ coater/developer to provide a resist layer thickness of 900 Å.

The photoresist-coated wafers were exposed through a mask on an ASML TWINSCAN XT:1900i immersion scanner using quadruple (Quad) illumination with 1.35 NA, 0.8 outer sigma, 0.65 inner sigma and XY polarization. The exposed wafers were post-exposure baked at 100° C. for 60 seconds and developed using 37.5 mL of 2-heptanone developer on a TEL CLEAN TRACK™ LITHIUS™ i+ coater/developer to give negative tone patterns. Critical dimensions (CDs) were measured on a Hitachi CG4000 CD SEM using a mask CD at 60 nm (the diameter of an opaque circle on the mask) and a pitch CD at 112 nm (a mask CD plus the distance between opaque circles) to compare the resolution capability of each formulation for ~55 nm contact holes. The following valued were determined for the lithographic results: exposure energy to print 53 nm holes at 112 nm pitch ($E_s$); exposure latitude (EL) of the photoresist, defined by the CD change ($\Delta$CD) per exposure energy (mJ/cm$^2$) within ±10% of a target CD (CD$_t$) according to the following formula:

$$EL=(1.1\times CD_t-0.9\times CD_t)/(E_{op} \text{ of } 1.1\times CD_t-E_{op} \text{ of } 0.9\times CD_t)$$

and CD uniformity (CDU) for the best exposure and focus by measuring 20 different images on one die, with approximately 9 holes (CDs)/image, the 3 sigma variation in the CD values being calculated and reported as CDU. The results are summarized in Table 2.

TABLE 2

| Ex. | Resist Composition | $E_s$ (mJ/cm$^2$) | Exposure Latitude (nm/(mJ/cm$^2$)) | CDU (3 s) (nm) |
|---|---|---|---|---|
| 23 (Comp) | Ex. 13 | 13.1 | 0.87 | 5.67 |
| 24 | Ex. 14 | 14.8 | 0.91 | 5.77 |

Examples 25 and 26

Similar procedures as described for Examples 23 and 24 were used for the photoresist formulations of Comparative Example 15 and Example 16. Critical dimensions (CDs) were measured on a Hitachi CG4000 CD SEM using a mask CD at 38 nm (the width of the line on the mask) and a pitch CD at 100 nm to compare the resolution capability and pattern collapse of each formulation for ~55 nm trenches. Exposure energy to print 53 nm holes at 112 nm pitch ($E_s$) exposure latitude were determined. Also determined was pattern collapse margin, which is a comparison of the largest trench CD before the line collapses (a larger trench or space value=better pattern collapse margin for the resist). The results are summarized in Table 3. The formulation containing EHAMA of Example 16 exhibited improved pattern collapse margin over the non-EHAMA-containing formulation of Comparative Example 15. Also, the EHAMA-containing formulation resolved trench CDs of 54.6 nm as compared with only 47.6 nm for the EHAMA-free composition.

TABLE 3

| Ex. | Resist Composition | $E_s$* (mJ/cm$^2$) | Exposure Latitude (nm/(mJ/cm$^2$)) | Pattern Collapse Margin (nm) |
|---|---|---|---|---|
| 25 (Comp) | Ex. 15 | 6.0 | 1.03 | 47.6 nm |
| 26 | Ex. 16 | 14.1 | 1.02 | 54.6 nm |

*Exposure energy to print 53 nm trenches at 100 nm pitch

Examples 27-32

300 mm silicon wafers were spin-coated with AR™ 40A antireflectant (Rohm and Haas Electronic Materials) to form a first bottom antireflective coating (BARC) on a TEL CLEAN TRAC LITHIUS i+ coater/developer. The wafer was baked for 60 seconds at 215° C., yielding a first BARC film thickness of 840 Å. A second BARC layer was next coated over the first BARC using AR™ 124 antireflectant (Rohm and Haas Electronic Materials), and was baked at 205° C. for 60 seconds to generate a 200 Å top BARC layer. Photoresist formulations of Examples 17 to 22 were then coated on the dual BARC-coated wafers and soft-baked at 90° C. for 60 seconds on a TEL CLEAN TRACK LITHIUS i+ coater/developer to provide a resist layer thickness of 900 Å.

The photoresist-coated wafers were exposed through a mask on an ASML TWINSCAN XT:1900i immersion scanner using annular illumination with 1.35 NA, 0.9 outer sigma, 0.7 inner sigma and XY polarization. The exposed wafers were post-exposure baked at 90° C. for 60 seconds and then developed using a 50/50 blend of 2-heptanone and n-butyl propionate for 25 seconds on a TEL CLEAN TRACK™ LITHIUS™ i+ coater/developer to give negative tone patterns. Critical dimensions (CDs) were measured on a Hitachi CG4000 CD SEM using a mask CD at 60 nm (the diameter of an opaque circle on the mask) and a pitch CD at 90 nm (a mask CD plus the distance between opaque circles) to compare the resolution capability of each formulation for ~45 nm contact holes. CD uniformity, exposure energy to print 53 nm holes at 112 nm pitch ($E_s$) and exposure latitude were determined, with the results being summarized in Table 4.

Comparing Comparative Examples 27-29 with Examples 30-32, respectively, it can be seen that the CDU values achieved by use of EHADA or EHAMA in place of HADA or HAMA, respectively, resulted in improved CDU values. Also, Comparative Example 29 which included a HAMA-containing resist polymer exhibited a poor resolution of 45 nm contact holes. By replacing HAMA with EHAMA in Example 32, lithographic resolution as determined by visual inspection of SEM images was greatly improved.

TABLE 4

| Ex. | Resist Composition | $E_s$* (mJ/cm$^2$) | Exposure Latitude (nm/(mJ/cm$^2$)) | CDU (3 s) (nm) |
|---|---|---|---|---|
| 27 (Comp) | 17 | 44.0 | 1.5 | 7.21 |
| 28 (Comp) | 18 | 37.2 | 2.1 | 6.83 |
| 29 (Comp) | 19 | 37.2 | 2.7 | 7.47 |
| 30 | 20 | 52.7 | 1.5 | 6.66 |
| 31 | 21 | 50.9 | 1.2 | 6.28 |
| 32 | 22 | 35.5 | 2.4 | 7.27 |

*Exposure energy to print 45 nm holes at 90 nm pitch

What is claimed is:

1. A method of forming a photolithographic pattern by negative tone development, comprising:

(a) providing a substrate comprising one or more layer to be patterned;

(b) applying a layer of a photoresist composition over the one or more layer to be patterned;

(c) patternwise exposing the photoresist composition layer to actinic radiation;

(d) heating the exposed photoresist composition layer in a post-exposure bake process; and (e) developing the post-exposure baked photoresist composition layer with an organic solvent developer, thereby forming a photoresist pattern;

wherein the photoresist composition comprises a polymer comprising a unit of the following general formula (I):

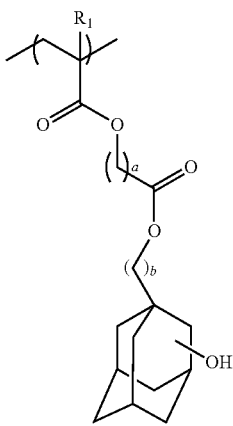

wherein: $R_1$ represents hydrogen or a $C_1$ to $C_3$ alkyl group; a represents an integer from 1 to 3; and b represents 0 or 1.

2. The method of claim 1, wherein the polymer further comprises a unit having an acid-labile group.

3. The method of claim 1, wherein the polymer further comprises a unit comprising a lactone group.

4. The method of claim 1, wherein in the general formula (I), a represents 1.

5. The method of claim 4, wherein in the general formula (I), b represents 1.

6. The method of claim 1, wherein in the general formula (I), b represents 1.

7. The method of claim 1, wherein $R_1$ represents hydrogen.

8. The method of claim 1, wherein $R_1$ represents methyl.

9. The method of claim 1, wherein the photoresist composition further comprises a second polymer that is a poly($C_3$ to $C_7$ alkyl methacrylate).

10. The method of claim 1, wherein the developer comprises 2-heptanone.

11. The method of claim 1, wherein the developer comprises n-butyl acetate.

* * * * *